(12) United States Patent
Matsuoka

(10) Patent No.: US 8,140,921 B2
(45) Date of Patent: Mar. 20, 2012

(54) SYSTEM FOR ELEVATOR ELECTRONIC SAFETY DEVICE

(75) Inventor: Tatsuo Matsuoka, Chiyoda (JP)

(73) Assignee: Mitsubishi Electric Corporation, Tokyo (JP)

( * ) Notice: Subject to any disclaimer, the term of this patent is extended or adjusted under 35 U.S.C. 154(b) by 1130 days.

(21) Appl. No.: 11/547,635

(22) PCT Filed: Jun. 22, 2004

(86) PCT No.: PCT/JP2004/009072
§ 371 (c)(1),
(2), (4) Date: Oct. 5, 2006

(87) PCT Pub. No.: WO2005/124562
PCT Pub. Date: Dec. 29, 2005

(65) Prior Publication Data
US 2008/0109092 A1    May 8, 2008

(51) Int. Cl.
*G11C 29/12* (2006.01)
*G11C 29/50* (2006.01)
(52) U.S. Cl. .................................. 714/719; 710/114
(58) Field of Classification Search .................. None
See application file for complete search history.

(56) References Cited

U.S. PATENT DOCUMENTS

| | | | |
|---|---|---|---|
| 4,610,000 A * | 9/1986 | Lee | 365/189.02 |
| 4,866,604 A | 9/1989 | Reid | |
| 5,392,879 A * | 2/1995 | Boyce et al. | 187/393 |
| 6,021,264 A * | 2/2000 | Morita | 710/117 |
| 6,151,265 A * | 11/2000 | Takita et al. | 365/230.03 |
| 6,345,372 B1 * | 2/2002 | Dieckmann et al. | 714/720 |
| 7,155,627 B2 * | 12/2006 | Matsui | 713/401 |

FOREIGN PATENT DOCUMENTS

| | | | |
|---|---|---|---|
| CN | 1353423 A | | 6/2002 |
| JP | 56010759 A | * | 2/1981 |
| JP | 63-39050 | | 2/1988 |
| JP | 5-30952 | | 4/1993 |
| JP | 5 266270 | | 10/1993 |

(Continued)

OTHER PUBLICATIONS

Reference AO-AQ have been the International Search Report. These references is being submitted herewith.

(Continued)

*Primary Examiner* — Jeffrey A Gaffin
*Assistant Examiner* — Dipakkumar Gandhi
(74) *Attorney, Agent, or Firm* — Oblon, Spivak, McClelland, Maier & Neustadt, L.L.P.

(57) ABSTRACT

An elevator electronic safety system in which reliability of malfunction check can be improved by performing a malfunction check on memory data, an address bus, and a data bus. A check on the address bus and the data bus is executed periodically by a hardware circuit and software processing, and a memory data malfunction check circuit. A designated address and designated data used to verify both cases of "0" and "1" for each of all bit signals on the address bus and the data bus in a memory system are input to or output (the address is only output) from a CPU periodically. For the address bus, plural designated addresses are detected by a designated address detection circuit. For the data bus, plural pieces of designated data are written into and read out from memories and the data before and after writing are compared with each other.

6 Claims, 5 Drawing Sheets

FOREIGN PATENT DOCUMENTS

| | | | | |
|---|---|---|---|---|
| JP | 05266270 | A | * | 10/1993 |
| JP | 8 16483 | | | 1/1996 |
| JP | 9-237230 | | | 9/1997 |
| JP | 2001 67271 | | | 3/2001 |
| JP | 2001067271 | A | * | 3/2001 |
| JP | 2003 337758 | | | 11/2003 |
| JP | 2003337758 | A | * | 11/2003 |

OTHER PUBLICATIONS

References have been the corresponding Search Report. These references is being submitted herewith.

Reference AR is dicussed in the specification. This reference is being submitted herewith.

References are additional prior art known to Applicant. These references is being submitted herewith.

* cited by examiner

SYSTEM FOR ELEVATOR ELECTRONIC SAFETY DEVICE

TECHNICAL FIELD

The present invention relates to an elevator electronic safety system in which the reliability of malfunction or abnormality check can be improved by performing not only a malfunction check on memory data but also a periodic malfunction check on an address bus and a data bus that are used when writing and reading memory.

BACKGROUND ART

As a conventional elevator electronic safety system (in particular, a method for checking a memory system), there has been proposed one which performs a check by the use of an error correction code (ECC) or the like, or a comparison check between two block memories (a main memory and an auxiliary memory)(see, for instance, Japanese patent application laid-open No. H08-16483).

According to such a conventional elevator electronic safety system, in checking a memory system, only an abnormality or malfunction check on memory data is carried out, but no check is performed at all as to whether a signal from a CPU is correctly input and output with respect to the address bus and the data bus that are used when memory is written and read. Accordingly, there has been a problem that the reliability of the malfunction check is low.

In particular, in case where very high reliability of the malfunction check is required as in the elevator electronic safety apparatus, low reliability of the malfunction check becomes a critical problem.

In addition, an additional circuit in this kind of system is almost composed of a built-in circuit, so it is required to form the additional circuit with a size as small as possible, thus making it difficult to take appropriate countermeasures.

DISCLOSURE OF THE INVENTION

The present invention is intended to solve the problems as referred to above, and has for its object to obtain an elevator electronic safety system which is capable of improving the reliability of malfunction check in a memory system (an address bus, a data bus, a main memory, and an auxiliary memory) used therein by executing a malfunction check on the address bus and the data bus in addition to a memory data malfunction check similar to a conventional system.

An elevator electronic safety system according to the present invention performs a check on an address bus and a data bus in addition to a conventional memory data malfunction check in a periodic manner by means of a hardware circuit and software processing.

That is, a designated address and designated data for checking able to verify both the cases of "0" and "1" for each of all the bit signals on the address bus and the data bus that are used in a memory system (buses, a main memory and an auxiliary memory), are input to or output (the address is only output) from a CPU in a periodic manner.

Here, the designated address is represented by "FF" and "00" in case of 8 bits, for instance. Similarly, the designated data is represented by set or combined values such as "AA" and "55", or "01", "02", "04", "08", "10", "20", "40", and "80" in case of 8 bits.

In addition, for the address bus, a plurality of designated addresses output are detected by a designated address detection circuit installed in the address bus, and if all the designated addresses can not be detected, i.e., even if there is only one designated address not detected, it is determined that there is a malfunction in the address bus.

Further, for the data bus, a plurality of pieces of designated data are once written into the memories and are then read out therefrom for comparison therebetween, and if all the pieces of the designated data read out from the memories do not coincide with each other, i.e., even if there is only one piece of the designated data that does not coincide with each other, it is determined that there is a malfunction in the data bus.

BEST MODE FOR CARRYING OUT THE INVENTION

Hereinafter, a first embodiment of the present invention will be described in detail while referring to the accompanying drawings.

Figure 1:
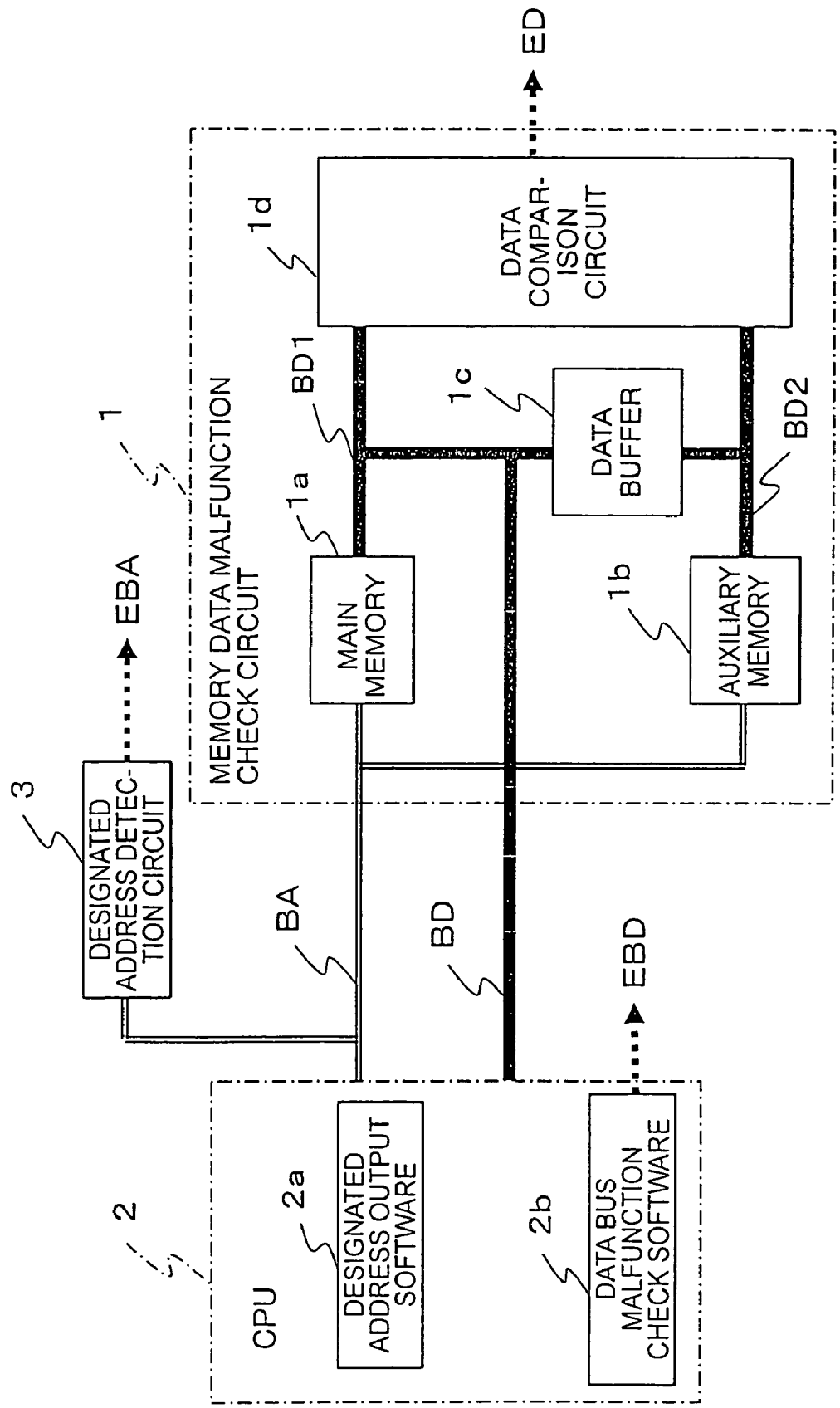
FIG. 1 is a block diagram schematically showing an elevator electronic safety system according to a first embodiment of the present invention.

FIG. 1 shows the schematic construction of an elevator electronic safety system according to a first embodiment of the present invention.

In FIG. 1, the elevator electronic safety system includes a memory data malfunction check circuit 1 that serves to check the malfunction of memory data, a CPU 2, and a designated address detection circuit 3 that serves to check the malfunction of an address bus.

The memory data malfunction check circuit 1a includes a main memory 1a and an auxiliary memory 1b (RAM) that are arranged in parallel with each other so as to be allocated to the same address space in a overlapped manner, data buffer 1c that serves to avoid the collision of the output data from the auxiliary memory 1b, and a data comparison circuit id that serves to make a comparison between each piece of data of the main memory 1a and the corresponding piece of the auxiliary memory 1b so as to check data malfunction.

In addition, though not illustrated herein, the memory data malfunction check circuit 1 is provided with an error correction code check circuit, as in a conventional system.

The CPU 2 includes a designated address output software 2a for outputting a designated address at the time of data malfunction check, a data bus malfunction check software 2b that is executed at the time of data bus malfunction check, and a ROM (not shown) for storage of programs.

In the memory data malfunction check circuit 1, the main memory 1a and the auxiliary memory 1b are connected to the CPU 2 through an address bus BA and a data bus BD, respectively, so that data for an elevator electronic safety apparatus is written from the CPU 2, and read out to the CPU 2.

The data bus BD is branched into a main memory data bus BD1 and an auxiliary memory data bus BD2 in the memory data malfunction check circuit 1, so that the main memory 1a and the auxiliary memory 1b are connected to the data comparison circuit 1d through the main memory data bus BD1 and the auxiliary memory data bus BD2, respectively.

A data buffer 1c is interposed in the auxiliary memory data bus BD2.

At the time of checking the malfunction of the memory data, the data comparison circuit 1d compares individual pieces of memory data input through the main memory data bus BD1 and the auxiliary memory data bus BD2, respectively, and outputs a data malfunction signal ED when it makes a determination that there is a malfunction in the memory data.

The designated address detection circuit 3 is connected to the CPU 2 through the address bus BA so as to detect a designated address at the time of checking the malfunction of the address bus BA, and outputs an address bus malfunction signal EBA when it is determined that there is a malfunction in the address bus BA.

The designated address output software 2a in the CPU 2 operates at the time of checking the malfunction of the address bus BA, and outputs a designated address to the designated address detection circuit 3 in a periodic manner, as will be described later.

The data bus malfunction check software 2a in the CPU 2 operates at the time of checking the malfunction of the address bus BD, and outputs a data bus malfunction signal EBD when it makes a determination that there is a malfunction in the data bus BD.

Figure 2:
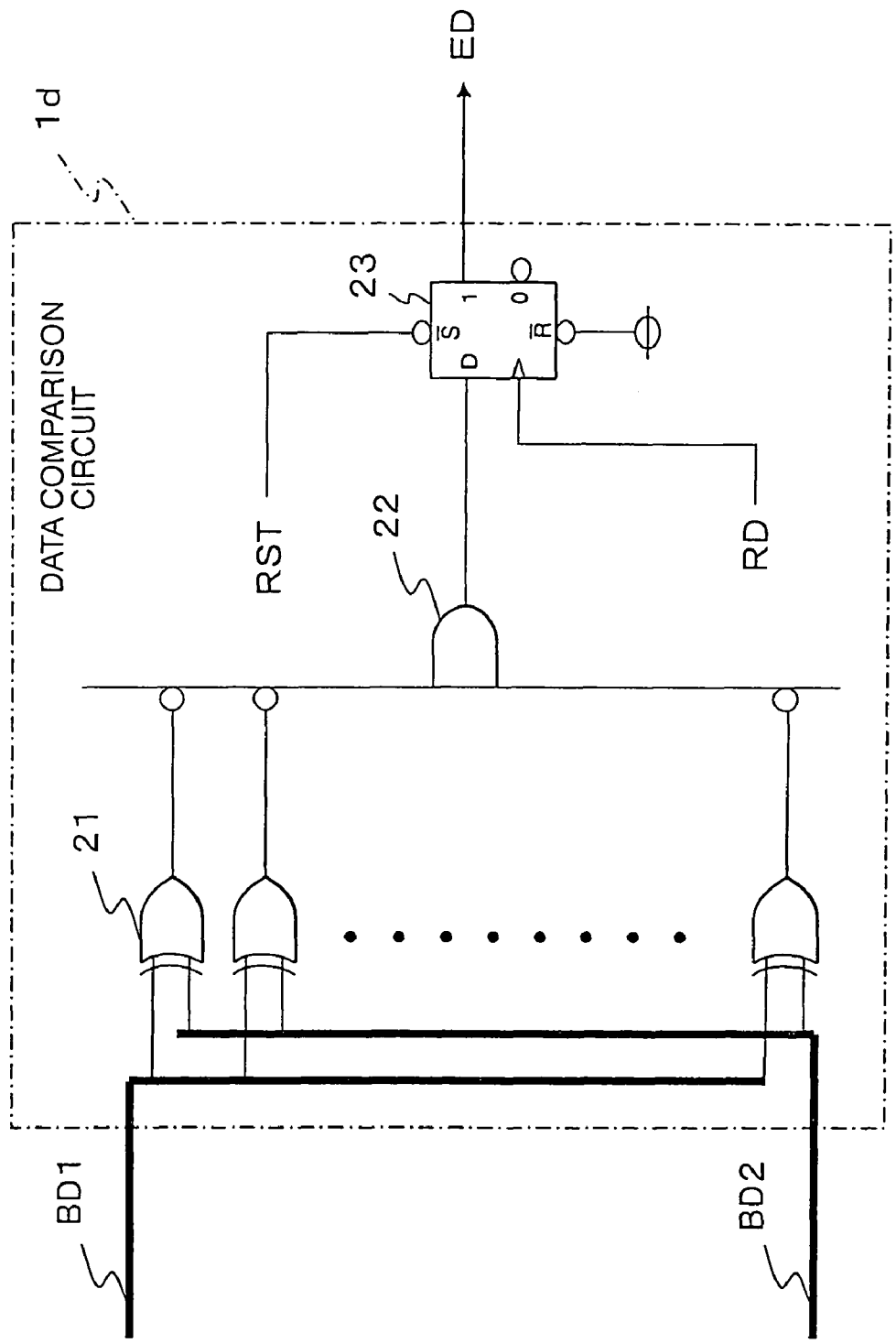
FIG. 2 is a circuit diagram showing a concrete example of a data comparison circuit for data malfunction check in FIG. 1.

FIG. 2 specifically shows the data comparison circuit 1d for data malfunction check in FIG. 1, wherein the data comparison circuit 1d is composed of a plurality of exclusive OR gates 21, an AND gate 22 and a D-type latch circuit 23 using a memory read signal RD.

In FIG. 2, the data comparison circuit 1d includes the exclusive OR gates 21 arranged in parallel with one another, the AND gate 22 that takes the logical product of the respective output signals of the exclusive OR gates 21, and the D-type latch circuit 23 that receives an output signal of the AND gate 22 as a D terminal input and output an H (logic "1") level signal as the data malfunction signal ED.

Each of the exclusive OR gates 21 receives data from the main memory data bus BD1 as one input signal, and data from the auxiliary memory data bus BD2 as the other input signal, and it outputs an L (logic "0") level signal when both of the input signals coincide with each other, and outputs an H (logic "1") level signal when both of the input signals are not coincide with each other.

The AND gate 22 takes in the inverted signal of the output signal from each of the exclusive OR gates 21, and outputs an H (logic "1") level signal when all the input signals are at an H level (i.e., the respective output signals of the exclusive OR gates 21 are all at an L level).

The D-type latch circuit 23 operates in response to the memory read signal RD, so that it changes the level of its output signal (the data malfunction signal ED) in response to a D terminal input (the output signal of the AND gate 22), and it is reset to its initial state in response to a reset signal RST.

Figure 3:
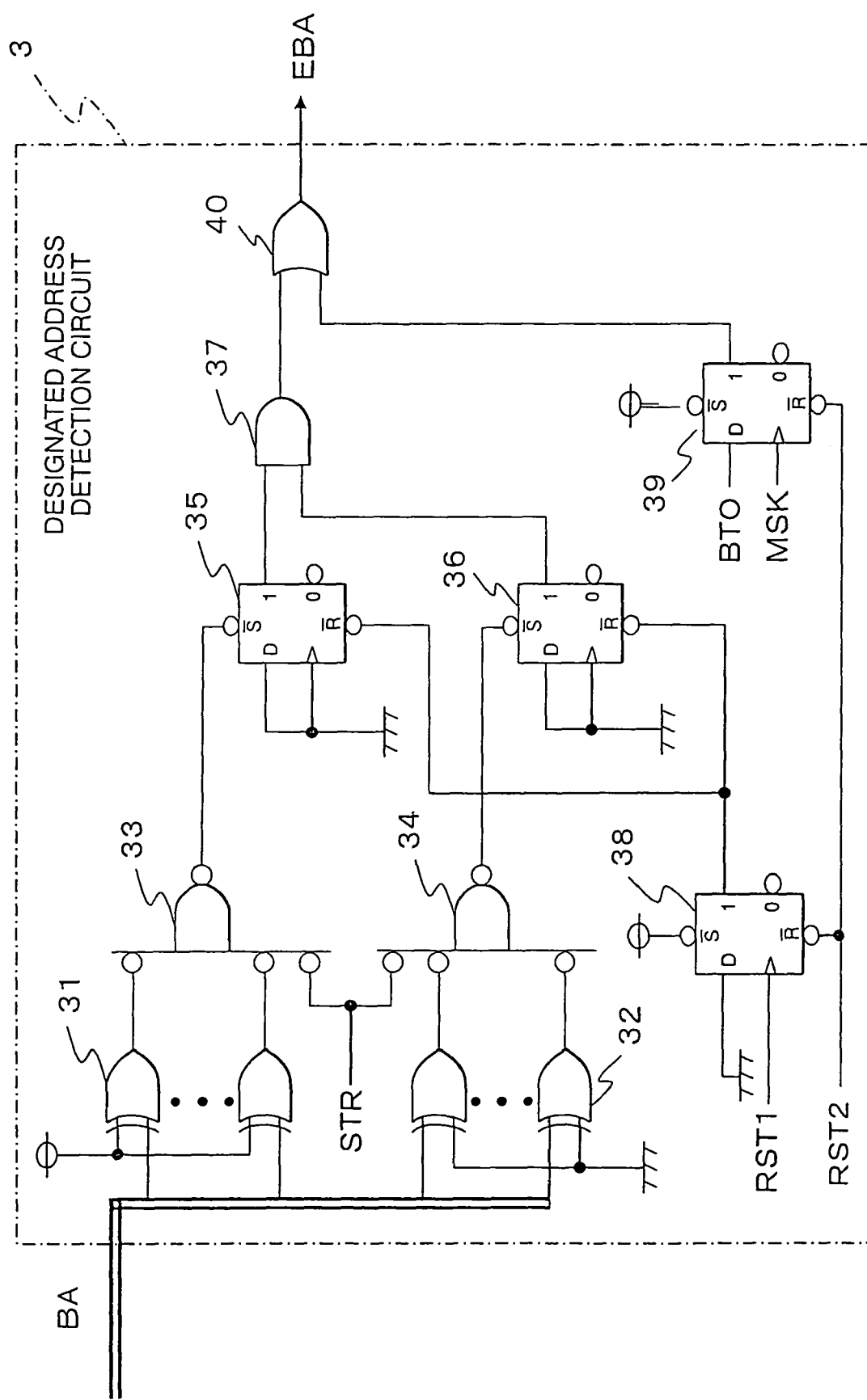
FIG. 3 is a circuit diagram showing a concrete example of a designated address detection circuit for address bus malfunction check in FIG. 1.

FIG. 3 specifically shows the designated address detection circuit 3 for address bus malfunction check in FIG. 1.

In FIG. 3, the designated address detection circuit 3 includes a plurality of exclusive OR gates 31 with an H level signal being supplied thereto as one input signal, a plurality of exclusive OR gates 32 with an L level signal being supplied thereto as one input signal, an NAND gate 33 that takes the logical product of the respective output signals of the exclusive OR gates 31 and the address strobe signal STR, an NAND gate 34 that takes the logical product of the respective output signals of the exclusive OR gates 32 and the address strobe signal STR, a D-type latch circuit 35 that receives an output signal of the NAND gate 33 as an input signal to its set terminal, a D-type latch circuit 36 that receives an output signal of the NAND gate 34 as an input signal to its set terminal, an AND gate 37 that takes the logical product of the respective output signals of the D-type latch circuits 35, 36, a D-type latch circuit 38 that operates in response to a reset signal RST1 of the designated address detection circuit 3, a D-type latch circuit 39 that operates in response to a mask signal MSK of the designated address detection circuit 3, and an OR gate 40 that takes the logical sum of the output signal of the AND gate 37 and the output signal of the D-type latch circuit 39.

A designated address is input through the address bus BA to the other input terminal of each of the exclusive OR gates 31, 32 that are arranged in parallel with one another.

Each of the exclusive OR gates 31 outputs an L level signal when the designated address input from the address bus BA is an H level signal, whereas it outputs an H level signal when the designated address is an L level signal.

On the contrary, each of the exclusive OR gates 32 outputs an H level signal when the designated address input from the address bus BA is an H level signal, whereas it outputs an L level signal when the designated address is an L level signal.

The output signal of each of the exclusive OR gates 31 is level inverted and input to the NAND gate 33 together with the address strobe signal STR.

Similarly, the output signal of each of the exclusive OR gates 32 is level inverted and input to the NAND gate 34 together with the address strobe signal STR.

Accordingly, if the address bus BA is sound or normal, the NAND gates 33, 34 each output an H level signal in a periodic and complementary manner according to a designated address ("FFFF", "0000") periodically input through the address bus BA in synchronization with the address strobe signal STR.

The D-type latch circuit 38 has its D input terminal impressed with an L level signal, so that it is operated by a first reset signal RST1. An output signal of the D-type latch circuit 38 is impressed to the respective reset terminals of the D-type latch circuits 33, 36.

The D-type latch circuit 39 has its D input terminal impressed with a 0 bit signal BTO (i.e., it becomes "0" when the mask is turned on, and "1" when the mask is turned off) of the data bus BD, so that it is operated according to a mask signal MSK.

The respective D-type latch circuits 38, 38 are reset respectively by a second reset signal RST2.

When the output signal of the AND gate 37 or the output signal of the D-type latch circuit 39 indicates an H level, the OR gate 40 outputs an address bus malfunction signal EBA.

In the elevator electronic safety system as constructed above, a malfunction check on the address bus BA according to the designated address output software 2a and the designated address detection circuit 3 as well as a malfunction check on the data bus BD according to the data bus malfunction check software 2b is executed in addition to a data malfunction check according to the memory data malfunction check circuit 1.

Now, reference will be made in more detail to the above-mentioned three malfunction check operations according to the first embodiment of the present invention while referring to FIG. 1 through FIG. 5.

Figure 4:
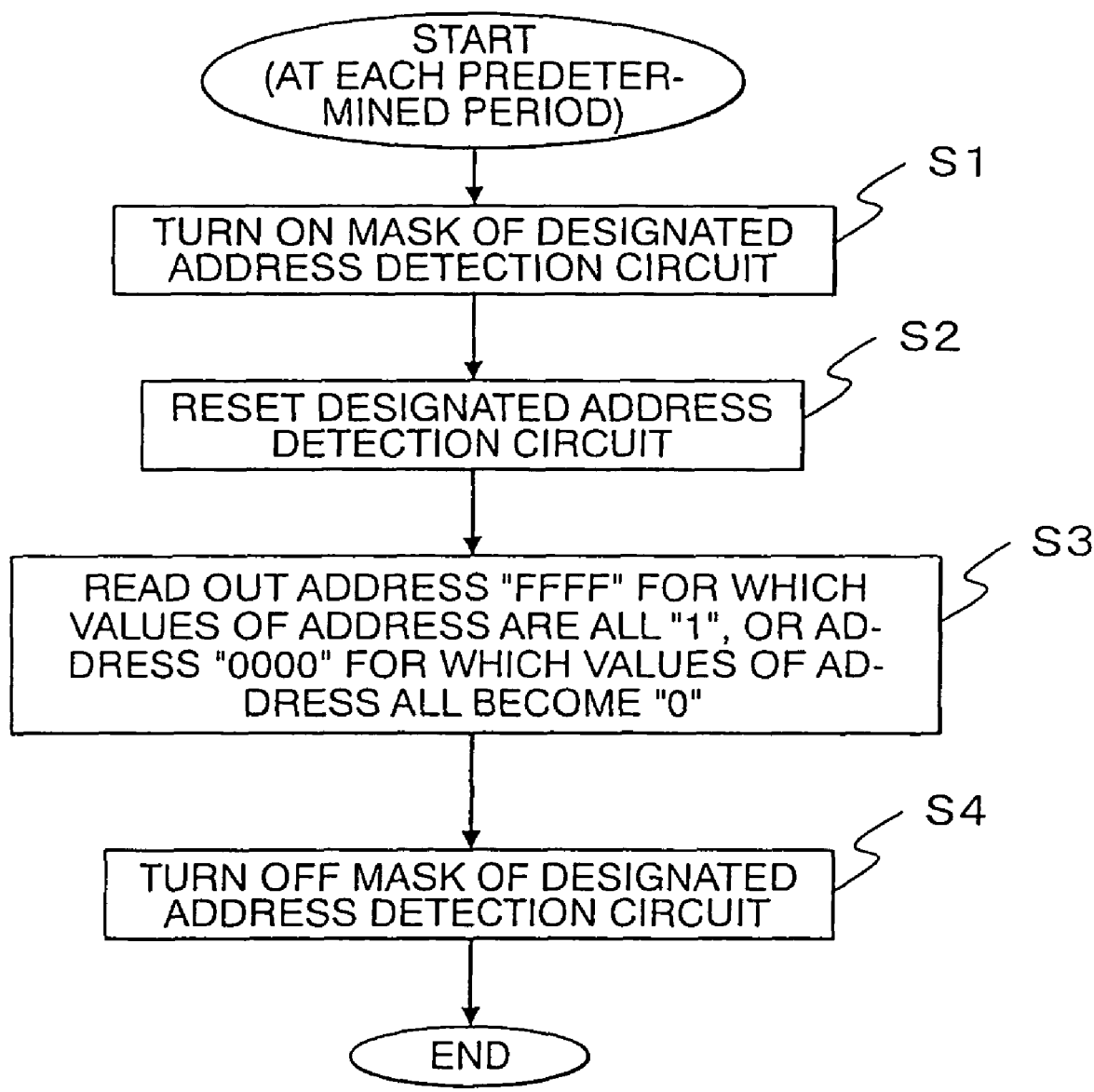
FIG. 4 is a flow chart showing a designated address output software that generates an address output with respect to the designated address detection circuit according to the first embodiment of the present invention.

FIG. 4 is a flow chart that shows the processing operation according to the designated address output software 2a and the designated address detection circuit 3 in the CPU 2, where there is illustrated an operations sequence when a designated address is output to the designated address detection circuit 3 at the time of checking the malfunction of the address bus BA.

Figure 5:
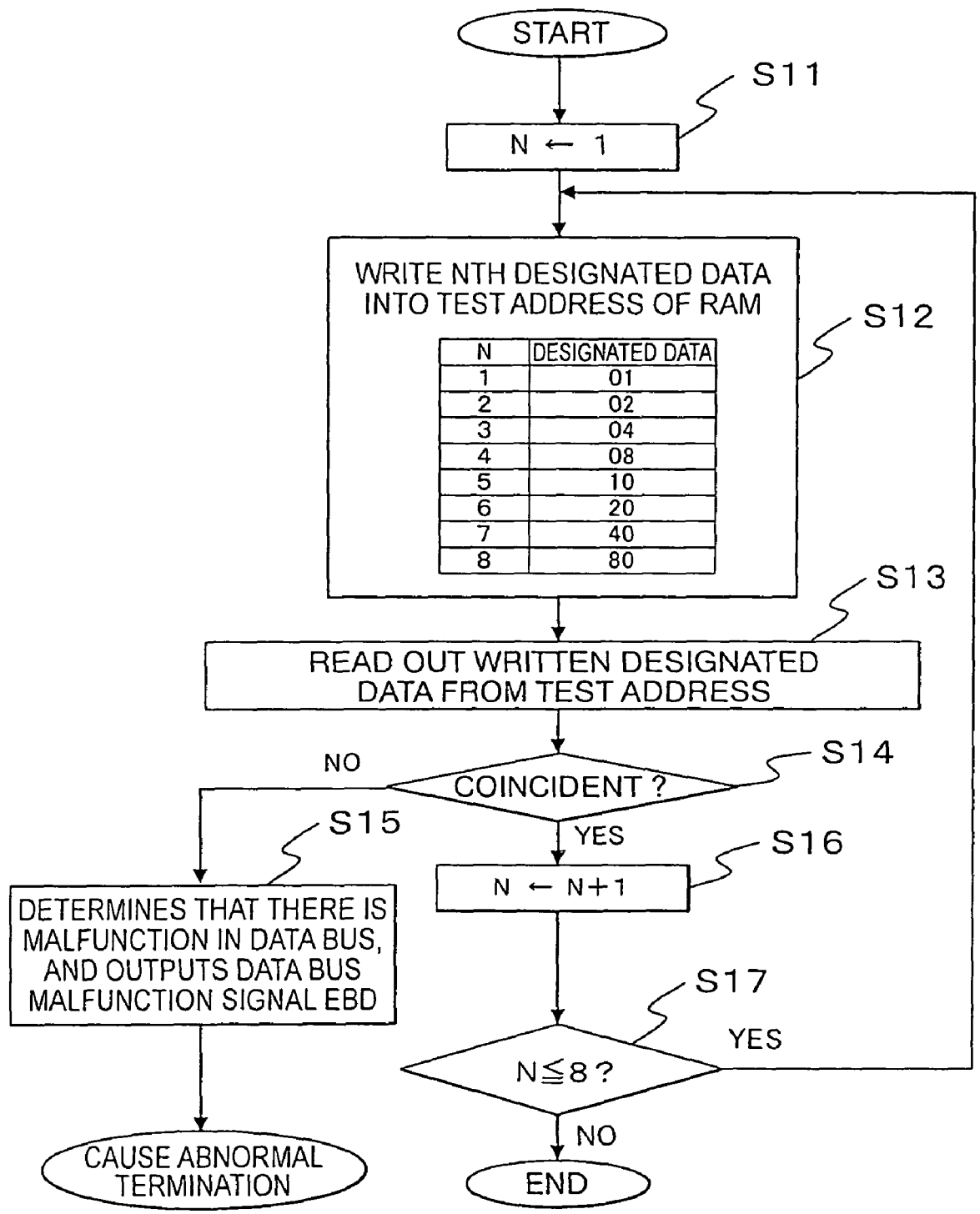
FIG. 5 is a flow chart showing a software for data bus malfunction check according to the first embodiment of the present invention.

FIG. 5 is a flow chart that shows the processing operation of the data bus malfunction check software 2b in the CPU 2.

First of all, the data malfunction check operation according to the memory data malfunction check circuit 1 will be described while referring to FIG. 1 and FIG. 2.

In the memory data malfunction check circuit 1, the same address space is allocated to the main memory 1a and the auxiliary memory 1b in a overlapped manner, so when the CPU 2 writes data into the main memory 1a and the auxiliary memory 1b, the same data is written into the same address of the main memory 1a and the auxiliary memory 1b, respectively.

On the other hand, when the CPU 2 reads out data from the main memory 1a and the auxiliary memory 1b, the data of the main memory 1a is read onto the main memory data bus BD1, and passed to the CPU 2 through the data bus BD, whereas data in the auxiliary memory 1b is read onto the auxiliary memory data bus BD2 but it is blocked by the data buffer 1c, as a result of which it is not sent to the data bus BD.

Accordingly, two memory outputs from the main memory 1a and the auxiliary memory 1b does not conflict with each other, and hence only the data of the main memory 1a is passed to the CPU 2, so writing and reading are executed normally.

Simultaneously with this operation, the main memory data read onto the main memory data bus BD1 and the auxiliary memory data read onto the auxiliary memory data bus BD2 are input to the data comparison circuit 1d where a comparison is carried out between both of these data.

The data comparison circuit 1d checks data abnormality or malfunction, and outputs a data malfunction signal ED if abnormality or malfunction (non-coincidence between these data) is detected.

Next, a malfunction check operation on the address bus BA according to the designated address output software 2a and the designated address detection circuit 3 in the CPU 2 will be described while referring to FIG. 1, FIG. 3 and FIG. 4.

The CPU 2 repeatedly performs the processing of FIG. 4 (steps S1 through S4) in a periodic manner by executing the designated address output software 2a by using a designated address for checking (e.g., "FF" and "00" in case of 8 bits) that is able to verify both the cases of "0" and "1" for each of all the bit signals on the address bus BA used in the memory system.

In addition, simultaneously with this, each designated address is detected by the designated address detection circuit 3 installed on the address bus BA.

When all the designated addresses can not be detected, the designated address detection circuit 3 makes a determination that there is a malfunction in the address bus BA, and outputs an address bus malfunction signal EBA.

In FIG. 4, the CPU 2 first turns on the mask of the designated address detection circuit 3 (step S1), operates the D-type latch circuit 39 in the designated address detection circuit 3, and impresses a 0 bit signal BTO (=0) to the D input terminal.

Subsequently, the CPU 2 resets the designated address detection circuit 3 by means of a first reset signal RST1 (step S2), and operates the D-type latch circuit 38.

Then, the CPU 2 reads out a maximum value address "FFFF" for which the values of the address are all "1" (or a minimum value address "0000" for which the values of the address all become "0" (step S3).

Finally, the CPU 2 turns off the mask of the designated address detection circuit 3 (step S4), and impresses a 0 bit signal BTO (=1) to the D input terminal of the D-type latch circuit 39 thereby to invert the operating state of the D-type latch circuit 39, and then exits the processing routine of FIG. 4.

Next, a malfunction check operation on the data bus BD according to the data bus malfunction check software 2b in the CPU 2 will be described while referring to FIG. 1 and FIG. 5.

The CPU 2 repeatedly performs a read and write check operation according to the processing of FIG. 5 (steps S11 through S17) in a periodic manner by using designated data for checking (e.g., set or combined values such as "AA" and "55", or "01", "02", "04", "08", "10", "20", "40", and "80" in case of 8 bits) that is able to verify both the cases of "0" and "1" for each of all the bit signals on the data bus BD used in the memory system.

If all the designated data do not coincide in the determination processing according to the data bus malfunction check software 2a, the CPU 2 makes a determination that there is a malfunction in the data bus BD, and outputs a data bus malfunction signal EBD.

In FIG. 5, first of all, the CPU 2 initializes a variable N specifying the designated data to "1" (step S11), and writes the Nth (=1st) designated data (="01") into a test address in the RAM (the main memory 1a and the auxiliary memory 1b) (step S12).

Subsequently, the designated data written in step S12 is read out from the test address (step S13), and it is determined whether the designated data thus read out coincides with the designated data before written (step S14).

When it is determined in step S14 that the designated data after read out does not coincide with the designated data before written (that is, NO), the CPU 2 assumes that there is a malfunction in the data bus BD, and causes an abnormal termination, while outputting a data bus malfunction signal EBD (step S15).

On the other hand, when it is determined in step S14 that the designated data after read out coincides with the designated data before written (that is, YES), the variable N is incremented (step S16), and it is further determined whether the variable N is equal to or less than "8" (step S17).

When it is determined as N≦8 in step S17 (that is, YES), a return is performed to the writing processing of the designated data (step S12), and then the above-mentioned processing steps S13 through S16 are repeatedly carried out.

Specifically, the 2nd designated data (="02"), the 3rd designated data (="02"), , the 8th designated data (="80") are sequentially written into the test address in the RAM (step S12), and then read out again (step S13) so as to determine coincidence or non-coincidence, as stated above (step S14).

On the other hand, when it is determined as N>9 in step S17 (that is, NO), it is assumed that the data bus malfunction check has been executed for all the pieces of designated data (N=1 to 8), and that all the pieces of designated data have coincided between before and after writing, and the CPU 2 normally terminates the processing routine of FIG. 5.

Thus, it is possible to improve the reliability of malfunction check by performing, in addition to the processing according to the memory data malfunction check circuit 1 similar to the conventional system, periodic malfunction check processing on the address bus BA and the data bus BD that are used when memory is written and read.

The invention claimed is:

1. An elevator electronic safety system for checking the integrity of a memory system in an elevator electronic safety apparatus, comprising:
   a CPU having a designated address output software and a data bus malfunction check software;
   a main memory and an auxiliary memory arranged in parallel and sharing a same address space, the main memory being directly connected to said CPU through an address bus and a data bus, the auxiliary memory being connected to the CPU through the address bus and connected to a data buffer through the data bus, the data buffer being directly connected to the CPU and the main memory through the data bus and being configured to prevent data from both the main memory and auxiliary memory from being transmitted to the CPU to avoid data collisions between the main memory and auxiliary memory;
   a memory data malfunction check circuit that compares data in said main memory and data in said auxiliary memory; and
   a designated address detection circuit connected to said CPU through said address bus,
   wherein said CPU executes said designated address output software to perform a malfunction check on said address bus in a periodic manner using said designated address detection circuit to periodically detect a designated address on the address bus, and
   said CPU executes said data bus malfunction check software to perform a malfunction check on said data bus in a periodic manner using said main memory and said auxiliary memory.

2. The elevator electronic safety system as set forth in claim 1, wherein said CPU executes said designated address output software to periodically output a designated address to said designated address detection circuit to verify cases of "0" and "1" for all bit signals on said address bus used in said main memory and said auxiliary memory; and
   said designated address detection circuit
      detects a plurality of designated addresses output from said CPU in a periodic manner,
      determines that said address bus is malfunctioning when all of said plurality of designated addresses are not detected, and
      outputs an address bus malfunction signal when all of said plurality of designated addresses are not detected.

3. The elevator electronic safety system as set forth in claim 2, wherein
   said CPU executes said data bus malfunction check software to periodically output and input designated data to verify cases of "0" and "1" for all bit signals on said data bus used in said main memory and said auxiliary memory; and
   said CPU
      performs a single write operation into said main memory and auxiliary memory and reads out from said main memory and said auxiliary memory a plurality of pieces of the designated data periodically output from said CPU,
      compares said plurality of pieces of designated data before and after being written into said main and auxiliary memory,
      determines that said data bus is malfunctioning when each of the compared plurality of pieces of designated data do not coincide, and
      outputs a data bus malfunction signal when each of said compared plurality of pieces of designated data do not coincide.

4. The elevator electronic safety system as set forth in claim 1, wherein
   said CPU executes said data bus malfunction check software to periodically output and input designated data to verify cases of "0" and "1" for all bit signals on said data bus used in said main memory and said auxiliary memory; and
   said CPU
      performs a single write operation into said main memory and auxiliary memory and reads out from said main memory and said auxiliary memory a plurality of pieces of the designated data periodically output from said CPU,
      compares said plurality of pieces of designated data before and after being written into said main memory and said auxiliary memory,
      determines that said data bus is malfunctioning when each of the compared plurality of pieces of designated data do not coincide, and
      outputs a data bus malfunction signal when each of said compared plurality of pieces of designated data do not coincide.

5. The elevator electronic safety system as set forth in claim 1, wherein the auxiliary memory is directly connected to the CPU through the address bus.

6. The elevator electronic safety system as set forth in claim 1, wherein the data buffer prevents data from the auxiliary memory from being transmitted to the CPU to avoid data collisions between the main memory and auxiliary memory when the memory data malfunction check circuit compares the data.

* * * * *